US006879496B1

(12) United States Patent
Marshall et al.

(10) Patent No.: US 6,879,496 B1
(45) Date of Patent: Apr. 12, 2005

(54) METHOD AND SYSTEM FOR REDUCING ELECTROMAGNETIC INTERFERENCE EMISSIONS

(75) Inventors: Robert A. Marshall, Georgetown, TX (US); Earl W. Boone, Round Rock, TX (US)

(73) Assignee: Cisco Technology, Inc., San Jose, CA (US)

( * ) Notice: Subject to any disclaimer, the term of this patent is extended or adjusted under 35 U.S.C. 154(b) by 441 days.

(21) Appl. No.: 10/042,966

(22) Filed: Jan. 9, 2002

(51) Int. Cl.$^7$ .................................................. H05K 9/00
(52) U.S. Cl. ..................... 361/818; 361/816; 361/800; 174/35 R; 174/35 GC
(58) Field of Search ................................ 361/752, 788, 361/799, 800, 736, 796, 818, 816; 174/35 R, 35 GC, 35 MS

(56) References Cited

U.S. PATENT DOCUMENTS

| | | | | |
|---|---|---|---|---|
| 4,640,561 A | * | 2/1987 | George | 439/77 |
| 5,409,384 A | * | 4/1995 | Green et al. | 439/67 |
| 5,537,294 A | * | 7/1996 | Siwinski | 361/753 |
| 5,943,219 A | * | 8/1999 | Bellino et al. | 361/816 |
| 6,033,254 A | * | 3/2000 | Neal et al. | 439/377 |
| 6,362,978 B1 | * | 3/2002 | Boe | 361/825 |

* cited by examiner

*Primary Examiner*—David Martin
*Assistant Examiner*—Dameon E. Levi
(74) *Attorney, Agent, or Firm*—Baker Botts L.L.P.

(57) ABSTRACT

According to one embodiment of the invention, a line card and backplane combination for reducing EMI emissions includes a backplane, a printed circuit board and a printed circuit board carrier attached to the printed circuit board. The bracket has a first leg and a second leg. The first leg electrically contacts the backplane. The combination also includes a clip electrically engaged with the second leg, the carrier and the printed circuit board.

26 Claims, 5 Drawing Sheets

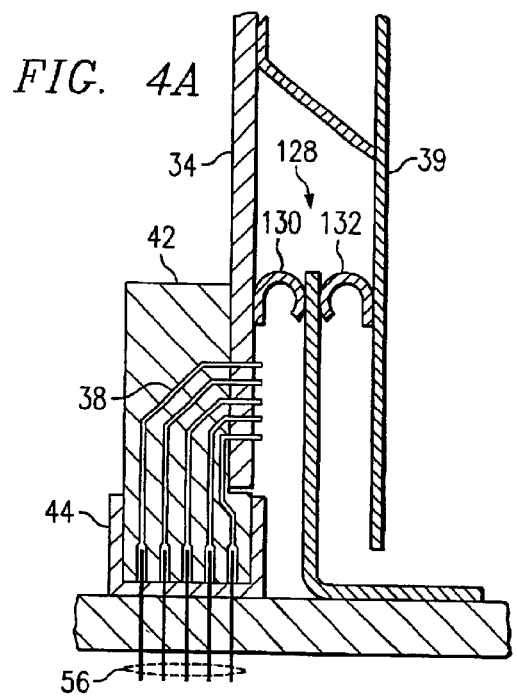
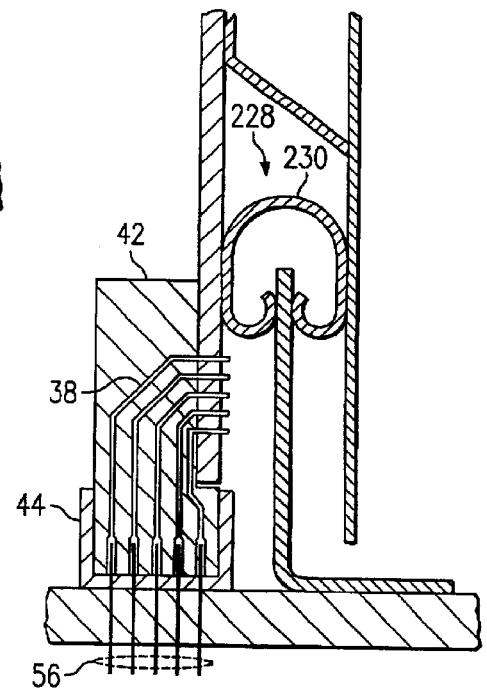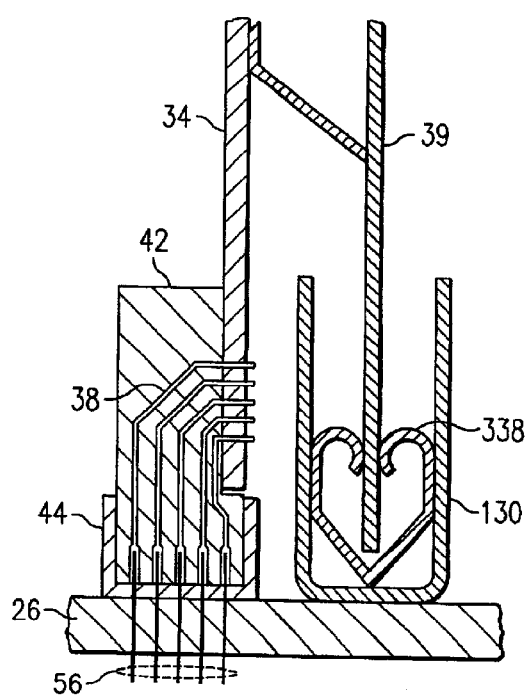

US 6,879,496 B1

METHOD AND SYSTEM FOR REDUCING ELECTROMAGNETIC INTERFERENCE EMISSIONS

TECHNICAL FIELD OF THE INVENTION

This invention relates generally to interference reduction and more particularly to a method and system for reducing electromagnetic interference emissions.

BACKGROUND OF THE INVENTION

Telecommunications has become increasingly important in today's society. Modern telecommunications systems often utilize a central office connecting a person's home or business or to a wide area network, such as the Internet. One component of a conventional central office is a digital subscriber line access multiplexer (DSLAM). A DSLAM often includes a plurality of line cards, a network interface card, and possibly a backup network interface card. Each line card often includes a plurality of modems for selectively connecting an individual to the Internet. A DSLAM is often formed from a chassis having a backplane. A backplane is generally a plate having appropriate circuitry embedded therein for coupling the various line cards to the network interface cards. However, as used in this document, backplane refers to any plate that may be used in a telecommunications or other chassis housing electrical equipment, whether or not related to telecommunications.

The line cards generate electromagnetic interference (EMI) emissions that may interfere with the data or voice signal intended to be communicated. To reduce EMI emissions, it is important to provide a low impedance path from the line card to the backplane. This allows the electromagnetic interference emissions to flow to the backplane rather than interfere with communications.

Some past systems addressing this problem have not been entirely satisfactory. For example, some past systems do not result in a low enough impedance path to the backplane to reduce electromagnetic emissions to a desired level. Further, some such systems, such as ones that use metal tabs or EMI strips, which are usually exposed, are easily damaged in production or in the field.

SUMMARY OF THE INVENTION

According to one embodiment of the invention, a line card and backplane combination for reducing EMI emissions includes a backplane, a printed circuit board, and a printed circuit board carrier attached to the printed circuit board. A bracket has a first leg and a second leg. The first leg electrically contacts the backplane. The combination also includes a clip electrically engaged with the second leg, the carrier and the printed circuit board.

Some embodiments of the invention provide numerous technical advantages. Some embodiments may benefit from all, some, or none of these advantages. For example, according to one embodiment, a backplane interfaced to a line card provides a low impedance ground path to reduce EMI emissions. In addition, the backplane is structurally strengthened. Further, contacts are protected between the sheet metal and the motherboard of the line cards and the contact to the backplane is not susceptible to damage during production.

Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following descriptions taken in connection with the accompanying drawings in which:

FIG. 4A shows an alternative embodiment of the clip of FIG. 3A;

FIG. 4B shows another alternative of the clip of FIG. 3A; and

FIG. 4C shows an alternative embodiment of portions of a backplane and line card combination according to the teachings of the invention.

DETAILED DESCRIPTION OF THE INVENTION

Embodiments of the present invention and its advantages are best understood by referring to FIGS. 1 through 4C of the drawings, like numerals being used for like and corresponding parts of the various drawings.

Figure 1:
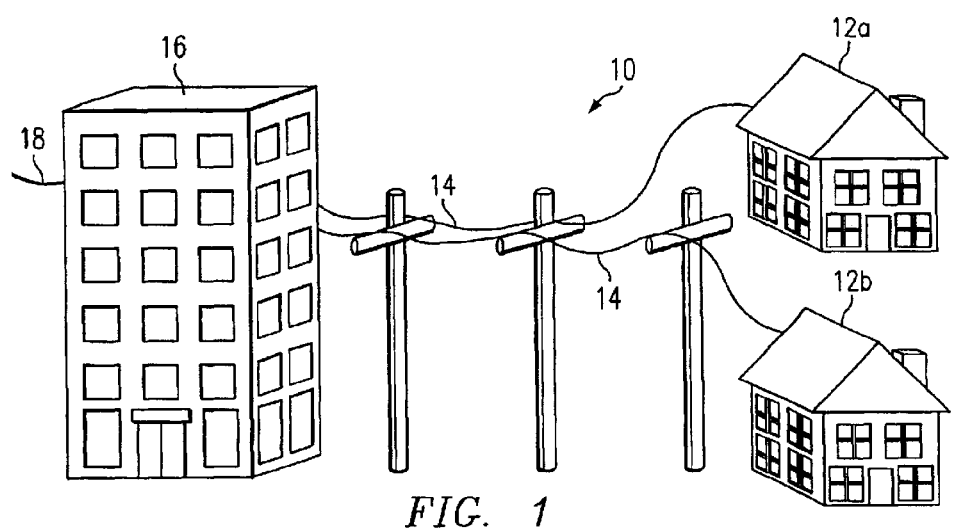
FIG. 1 is a schematic diagram showing a telecommunications system that may benefit from the teachings of the present invention.

FIG. 1 is a schematic diagram showing a telecommunications system 10 that may utilize the teachings of the invention. Telecommunications system 10 includes a plurality of customer premises 12a, 12b connected to a telecommunications central office 16 through a plurality of telephone wires 14. Central office 16 may in turn couple customer premises 12a and 12b to an Internet backbone 18. Telecommunications system 10 therefore allows communication of data between customer premises 12a and 12b and locations remote from customer premises 12a and 12b (not explicitly shown) through Internet backplane 18. Central office 16 may include a digital subscriber line access multiplexer (DSLAM) that effects switching of data from customer premises 12a and 12b to Internet backbone 18 as well as switching of data received over Internet backplane 18 to customer premises 12a and 12b.

Figure 2A:
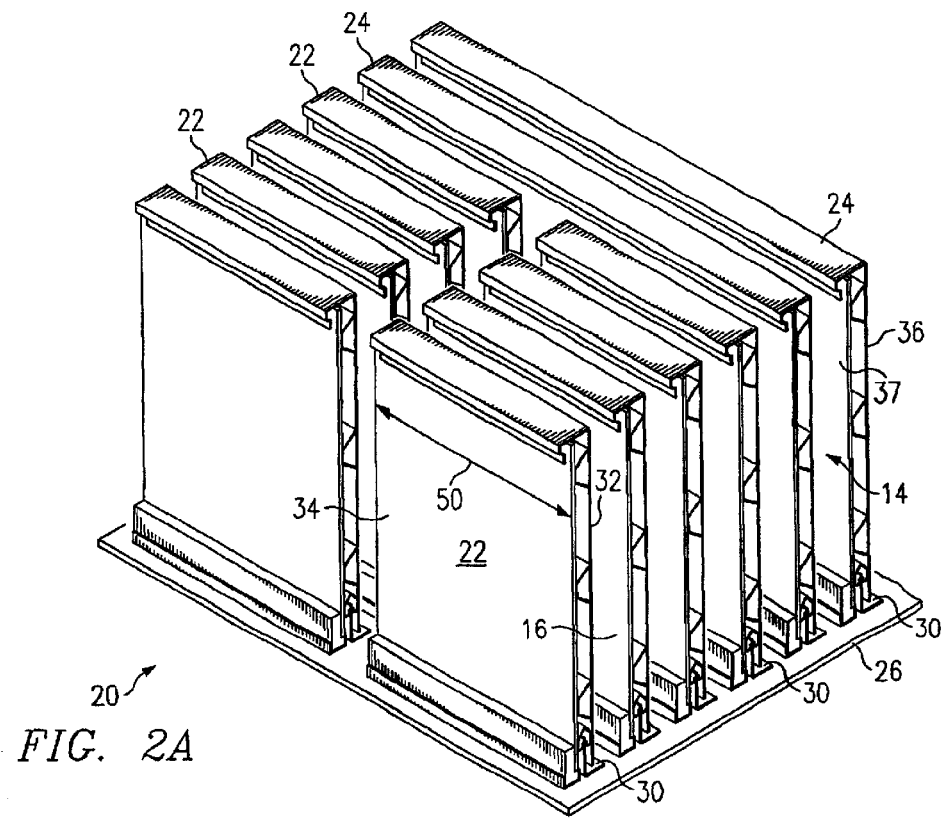
FIG. 2A is a schematic drawing showing a physical representation of a digital subscriber line access multiplexer (DSLAM) that might be used with the system of FIG. 1.
Figure 2B:
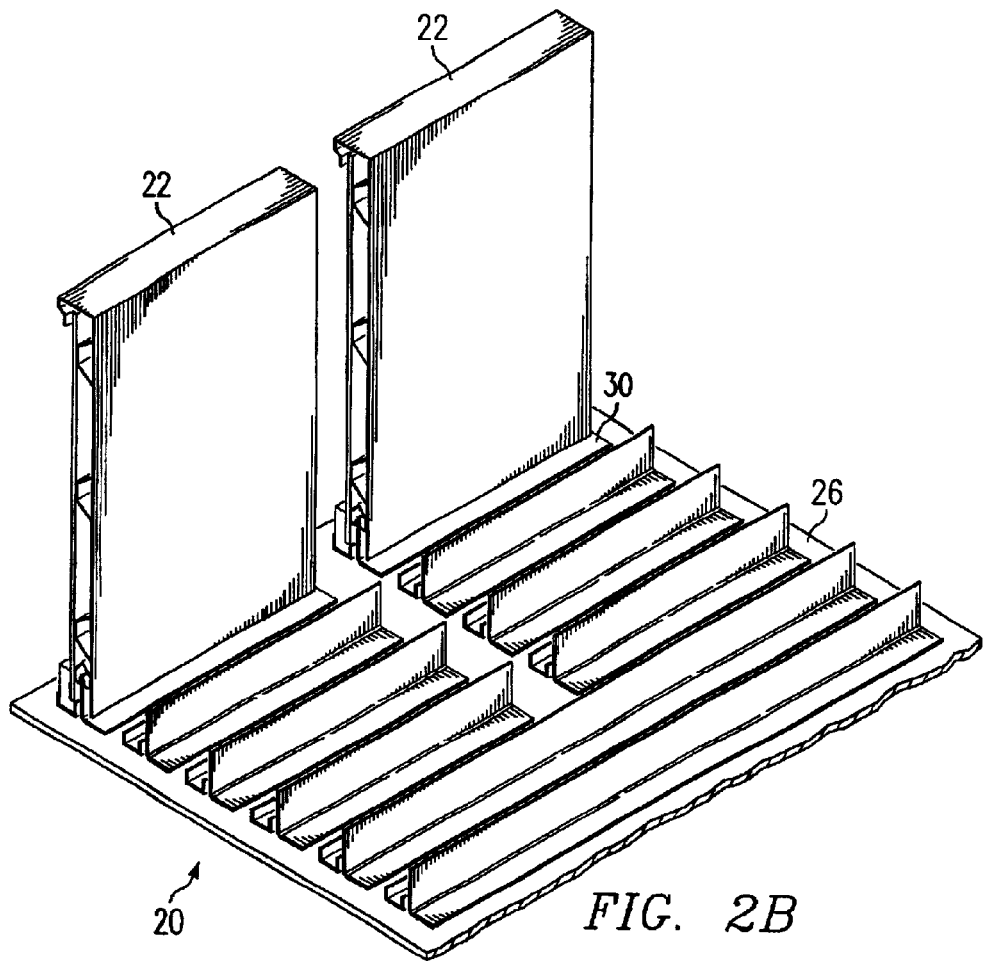
FIG. 2B is a schematic diagram of the DSLAM of FIG. 2A rotated ninety degrees and with portions removed showing another view of the backplane of the DSLAM.

FIG. 2A is a schematic drawing showing a DSLAM that may be used with the system of FIG. 1, and FIG. 2B is a schematic diagram of the DSLAM of FIG. 2A rotated ninety degrees and with portions removed showing another view of the backplane of the DSLAM. Central office 16 may include a telecommunications chassis 20 that includes a plurality of cards associated with processing communicated data. These cards may include, for example, line cards 22, network interface cards 24, and other types of cards. Line cards 22 function to receive data over telephone lines 14 and communicate the data to one of the network interface cards 24. The other, network interface card 24 may provide backup redundancy. Line cards 22 conversely communicate data received from network interface card 24 to an associated customer premises 12a, 12b over telephone lines 14. Network interface card 24 may perform a plurality of functions associated with transmitting and receiving data between customer premises 12a, 12b and Internet backbone 18; however, one particular application is switching. Line cards 22 and network interface cards 24 are coupled to a backplane 26 by a plurality of printed circuit board receivers, shown in FIGS. 3A through 3D. Additional details of these components are described in greater detail below in conjunction with FIGS. 3A through 4C.

According to the teachings of the invention, backplane 26 is formed with a plurality of brackets 30 for selectively coupling to respective portions of line cards 22 and network interface cards 24 to provide a low impedance path to transfer EMI emissions to backplane 26. Backplane 26 is grounded and therefore provides a low impedance path to ground allowing EMI emissions to flow safely to ground, as opposed to interfering with communications on line cards 22 or network interface cards 24.

By providing a bracket that runs a substantial portion of the length of printed circuit board 34, in one embodiment, a much lower impedance path may be provided than other methods for addressing EMI emissions. Furthermore, the use of such a bracket reduces the likelihood of damage during production and handling in the field, which sometimes plagues existing methods for addressing the EMI emissions problem. Additionally, an EMI clip is electrically engaged directly to both a printed circuit board and an associated carrier that form line card 22 or network interface card 24, according to one embodiment. Such engagement better directs EMI emissions to backplane 26. Details of that embodiment are described below.

DSLAM 20 is shown for clarity of illustration in the illustrated orientation; however, in many conventional implementations, backplane 26 is disposed vertically within a central office and forms the "back" of the chassis of DSLAM 20. However, the teachings of the invention are applicable regardless of the orientation of DSLAM 20. The teachings of the invention are described in the context of telecommunications DSLAM 20; however, the teachings of the invention are applicable in any setting where the reduction of EMI emissions is desired. Other such applications may include microprocessors, digital signal processors, mainframe computers, other telecommunications apparatus, and other non-telecommunications devices.

As described in greater detail below, line cards 22 each comprise a printed circuit board 34 and a card carrier 32, and network interface cards 24 each comprise a printed circuit board 37 and a card carrier 36. In the illustrated example, in which line card 22 functions as a telecommunications line card, printed circuit board 34 associated with line card 22 contains integrated circuits and associated wiring that forms a plurality of modems and associated control circuitry; however, any suitable circuitry, hardware, and/or software may be utilized to perform desired functions of the card without departing from the teachings of the invention, including the functions of a multi-board. Similarly, printed circuit board 37 associated with network interface card 24 includes integrated circuits and associated circuitry for performing the desired functions of the network interface card 24, such as those described above; however, any suitable combination of circuitry, hardware, and/or software may be utilized to perform the desired functions of the card without departing from the scope of the present invention. Card carriers 32 and 36 may be formed from any suitable generally rigid member that is capable of supporting printed circuit boards 34 and 37 for insertion into a backplane 26. For example, card carrier 32 may be formed from metal; however any suitable material may be utilized. Using conductive materials for card carriers 32 and 36 results in greater EMI emissions reduction by providing a lower impedance path to backplane 26. Carriers 32 and 36 may be formed by any suitable process, such as stamping, extrusion, molding, or other suitable techniques.

Figure 2C:
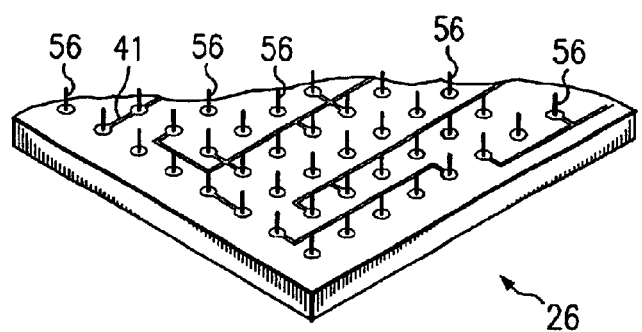
FIG. 2C is a plan view of the DSLAM of FIG. 2A, showing a plurality of pins and electrical traces on the underside of the backplane of FIG. 2A.

FIG. 2C is a plan view of portions of the DSLAM of FIG. 2A, showing a plurality of pins and electrical traces on the backside of the backplane of FIG. 2A. As illustrated in FIG. 2C, the back side of backplane 26 may be formed with a plurality of pins 56 electrically connected through backplane 26 to pins within a printed circuit board receiver 42 (FIGS. 3A through 3D). Such pins are shown and described in greater detail below in conjunction with FIG. 3D. These pins may be further connected to wire traces 41 or other suitable conductors along backplane 26 to provide connections to, for example, network interface cards 24. For clarity of illustration, only a few of such wire traces are shown in FIG. 2C.

FIGS. 3A through 4C illustrate additional details of line cards 22. Network interface cards 24 may be formed in a similar fashion.

Figures 3A, 3B:
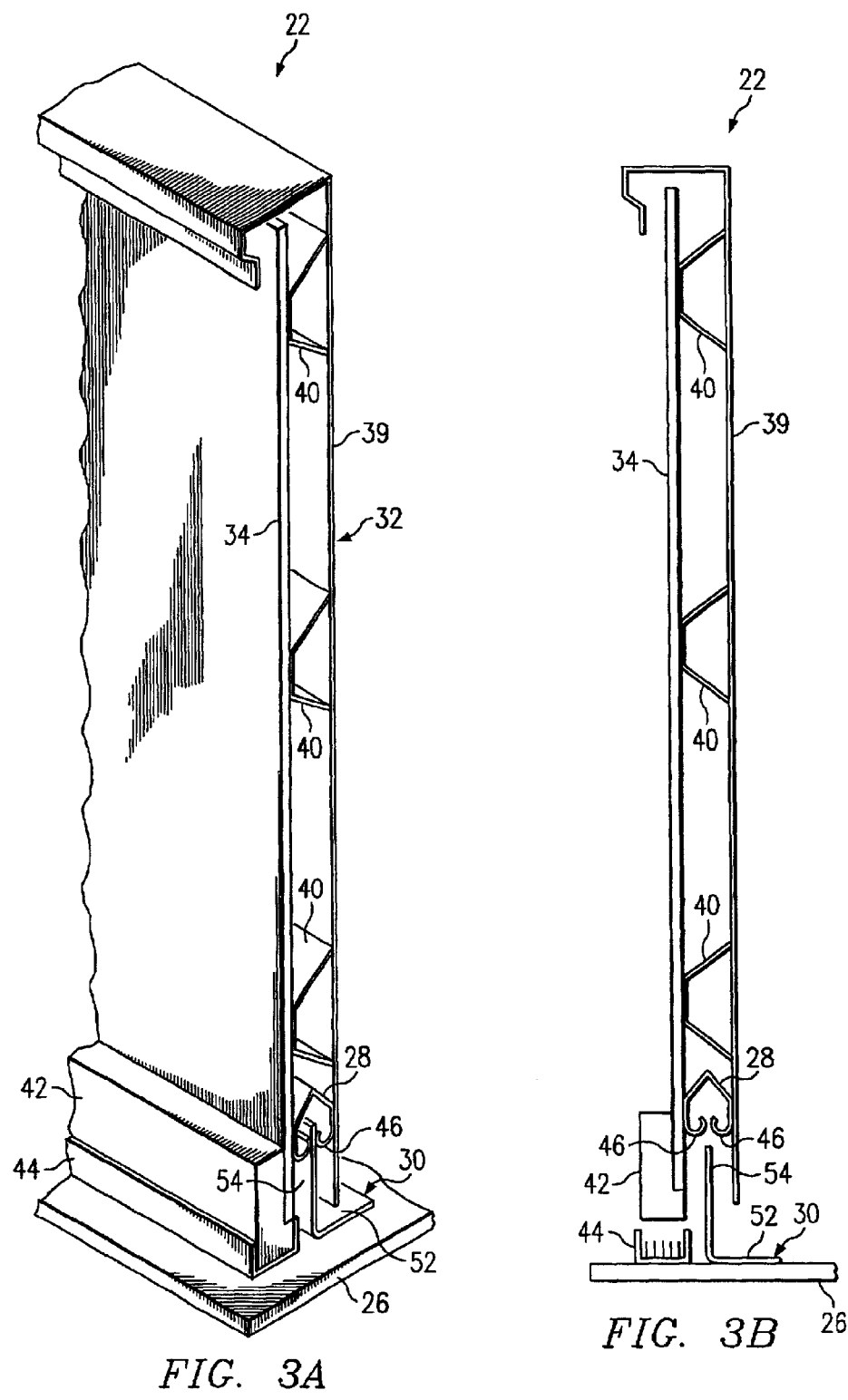
FIG. 3A is an isometric drawing of a line card of the DSLAM of FIGS. 2A through 2C engaged with a portion of the backplane of those FIGURES.
FIG. 3B is an elevation view of the line card and backplane combination of FIG. 3A showing the line card disengaged from the backplane.
Figure 3C:
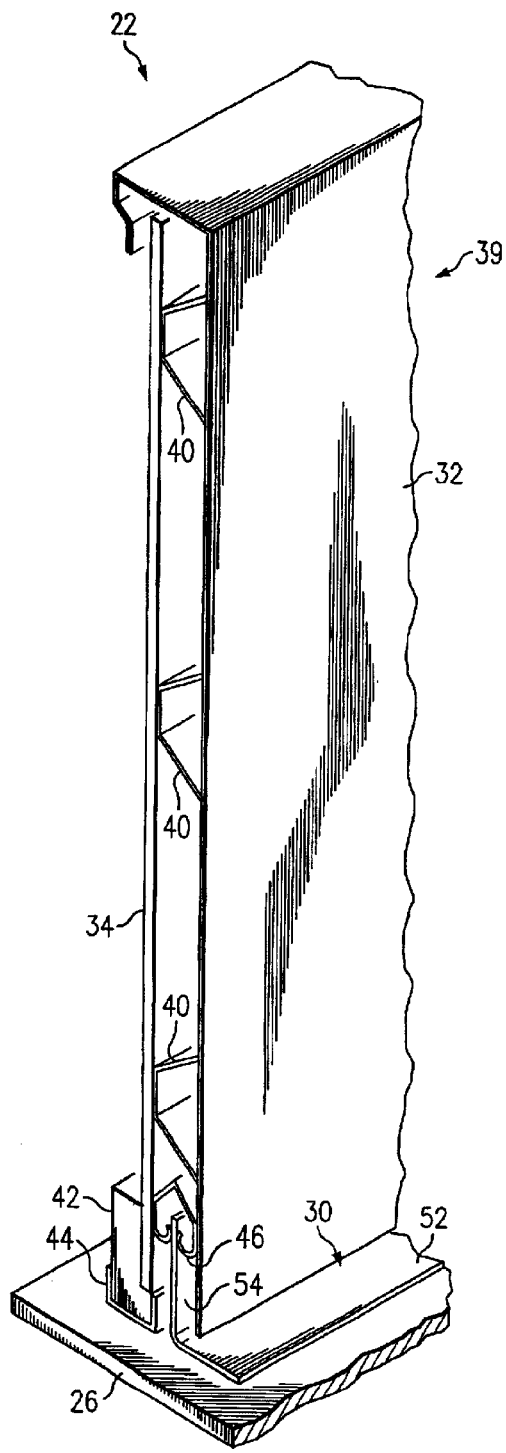
FIG. 3C is an isometric drawing of the backplane and line card combination of FIG. 3A rotated ninety degrees and showing the bracket of the backplane.

FIG. 3A is an isometric drawing of line card 22 engaged, with a portion of backplane 26 of FIG. 2A. FIG. 3B is an elevation view of line card 22 and backplane 26 combination of FIG. 3A showing line card 22 engaged with backplane 26. FIG. 3C is an isometric drawing of the backplane 26 and line card 22 combination of FIG. 3A rotated ninety degrees and showing more clearly a bracket 30 of backplane 26.

Additional details of line card 24 and backplane 26 and described below with reference to FIGS. 3A through 3D. As shown, line card 22 includes a carrier 32 and a printed circuit board 34. Carrier 32 may be formed with a flat portion 39 and a plurality of standoffs 40. Standoffs may affix to printed circuit board through screws, bolts, or other suitable fasteners (not explicitly shown). Standoffs 40 may be formed through stamping or dimpling sheet metal, or through other suitable techniques. Carrier 32 also comprises an EMI clip 28. EMI clip 28 is formed in this example, with a pair of curved portions 46 for selective engagement with bracket 30; however, EMI clip 28 may be formed in any suitable fashion that allows electrical coupling of printed circuit board 34 and carrier 32 to backplane 26 by bracket 30. Additional examples of EMI clip 28 are illustrated in FIGS. 4A through 4C. EMI clip 28 may be formed from a generally conductive material, such as metal, including beryllium copper; however other suitable materials may be used. In this example, EMI clip 28 is affixed to carrier 32; however, clip 28 could instead be affixed to printed circuit board 34 or affixed to both printed circuit board 34 and carrier 32. EMI clip 28 may extend over substantially the entire length of bracket 30, or may extend over only portions of the bracket. Further, EMI clip 28 may be formed with a plurality of discontinuous sections over portions of the length of bracket 30.

Printed circuit board 34 may be formed with a plurality of female receptors forming receptor assembly 42. Receptors within receptor assembly 42 are illustrated in greater detail in FIG. 3D.

Backplane 26 may be formed with a printed circuit board receiver 44. Printed circuit board receiver 44 may include a plurality of pins for engaging with receptor assembly 42, as illustrated and described in greater detail in conjunction with FIG. 3D. Backplane 26 is also formed with an EMI reduction connector 30, which in the illustrated example is a right angle bracket, for engagement with EMI clip 28. According to the teachings of the invention, connector, or bracket, 30 may extend substantially the length of printed circuit board 34. In this context, length of printed circuit board 34 refers to the length into the page of FIGS. 3A, 3B, 3C and 3D. This length is also denoted by reference numeral 50 in FIG. 2A. Alternatively, bracket 30 may extend only a portion of the length of printed circuit board 34. Additionally, bracket 30 may be divided into a plurality of discontinuous sections. Bracket 30 may be formed integral with backplane 26, may be attached through screws or other fasteners, or may be otherwise formed together with backplane 26.

In this example, bracket 30 comprises two legs 52 and 54. Leg 54 engages with EMI clip 28 to provide a low impedance conductive path to backplane 26. Although a right angle bracket is shown, other suitable connectors for coupling backplane 26 to carrier 32 or printed circuit board 34 may be utilized. For example, connectors having an "I", "Z" or "U" configuration may also be used as may other types of connectors.

Figure 3D:
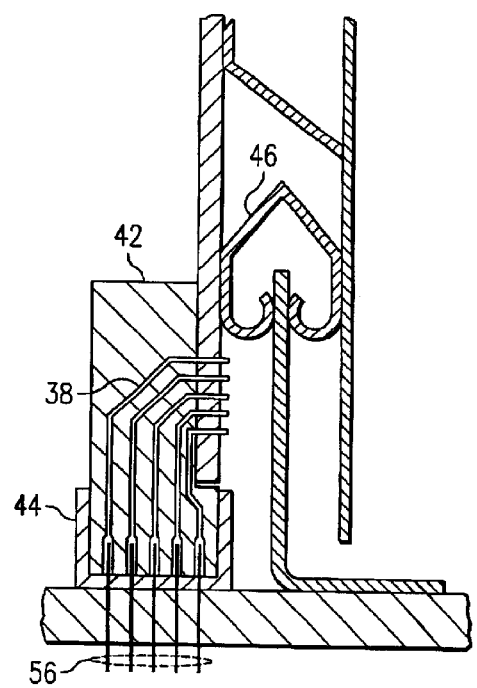
FIG. 3D is an exploded view of portions of the line card and backplane combination of FIG. 3A showing engagement of female receptors on the line card with pins on the backplane.

Receptor assembly 42 comprises a plurality of female receptors 38 (FIG. 3D). Printed circuit board receiver 44 comprises a plurality of pins 40. For both printed circuit board receiver 44 and receptor assembly 42, a plurality of receptors or a plurality of pins along the length of line card 22 may be provided, but only the cross-section of such is shown in FIG. 3D.

With reference to FIG. 3B, the coupling of printed circuit board 34 to printed circuit board receiver 28 is described. Line card 22 together with printed circuit board 34 is moved toward backplane 26. Receptor assembly 42 engages with printed circuit board receiver 44 on backplane 26. As receptor assembly 42 engages printed circuit board receiver 44, EMI clip 28 engages leg 54 of bracket 30. This provides a low impedance conductive path to backplane 26.

FIG. 3D is an exploded view of portions of line card 22 and backplane 26 combination of FIG. 3A showing engagement of pins on the line card with female receptors on the backplane. Pins 56 are formed as part of printed circuit board receiver 44. Receptor assembly 42 comprises a plurality of female receptors 38 for receiving pins 56. Although in this example receptor assembly 42 comprises female connectors and printed circuit board receiver 44 comprises male connectors, each may be formed with the other type of connector as desired without departing from the scope of the teachings of the invention.

FIG. 4A is an alternative embodiment of the clip of FIG. 3A. Clip 128 in FIG. 4A is substantially similar to clip 28, except that it is formed in two separate portions, portions 130 and 132. Portion 130 is attached to printed circuit board 34, and portion 132 is attached to flat portion 39 of card carrier 32.

FIG. 4B is another alternative of the clip of FIG. 3A. Clip 228 in FIG. 4B is substantially similar to clip 28, but is formed with a curved section 230.

FIG. 4C shows an alternative embodiment of portions of a backplane and line card combination according to the teachings of the invention. In the embodiment of FIG. 4C, bracket 30 is replaced with a U-shaped bracket 130 that is attached to backplane 26. A clip 338, which may be substantially similar to clip 46, 128, or 228, is coupled to U-shaped bracket 130, as opposed to printed circuit board 34 or flat plate 39 of card carrier 32, and instead engages with flat plate 39 of card carrier 32. This combination provides a low impedance path between card carrier 34 and backplane 26.

Although the present invention and its advantages have been described in detail, it should be understood that various changes, substitutions, and alterations can be made therein without departing from the spirit and scope of the present invention as defined by the appended claims.

What is claimed is:

1. A line card and backplane combination for reduced EMI emissions comprising:
    a backplane;
    a printed circuit board;
    a printed circuit board carrier attached to the printed circuit board;
    a bracket having a first leg and a second leg, the first leg electrically contacting the backplane; and
    a clip electrically engaged with the second leg, the it carrier, and the printed circuit board.

2. The combination of claim 1, wherein:
    the printed circuit board has a length;
    the bracket has a length that is at least a majority of the length of the printed circuit board; and
    the clip is electrically engaged with the second leg, the carrier, and the printed circuit board over the length of the bracket.

3. The combination of claim 1, wherein the bracket comprises a right angle bracket having the right angle formed by the first leg and the second leg.

4. The combination of claim 1, wherein the clip is formed from beryllium copper.

5. The combination of claim 1, wherein the carrier comprises a flat portion and a plurality of standoffs extending from the flat portion.

6. The combination of claim 1, wherein the bracket has a length that is substantially the same as the length of the printed circuit board carrier.

7. The combination of claim 1, and further comprising a printed circuit board receiver formed on the backplane substantially parallel to the bracket, the receiver engaged with the printed circuit board.

8. The combination of claim 1, wherein the clip comprises a clip having a cross section that comprises two curved sections adapted to receive the first leg therebetween and first and second flat sections, the first flat section engaging the printed circuit board and the second flat section affixed to the carrier.

9. The combination of claim 1, wherein the clip comprises a clip having a cross section having two disconnected portions.

10. The combination of claim 1, wherein the clip comprises a clip having a cross section that comprises two curved sections adapted to receive the first leg therebetween and a third curved section connecting the two curved sections together.

11. The combination of claim 1, wherein the printed circuit board comprises a motherboard.

12. A printed circuit board and carrier combination comprising:
    a plate having a length and an edge;
    an EMI clip electrically engaged with and extending a substantial portion of the length of the plate and formed proximate to the edge;
    a plurality of standoffs extending from the plate; and a printed circuit board affixed to the standoffs and electrically engaged with the EMI clip.

13. The combination of claim 12, wherein the clip comprises two opposing receiving sections operable to receive a leg of a bracket therebetween.

14. The combination of claim 12, wherein the clip is affixed to the printed circuit board.

15. The combination of claim 12, wherein the EMI clip extends the length of the plate.

16. The combination of claim 13, wherein the EMI clip further comprises first and second flat portions, the first flat portion engaged with the printed circuit board and the second flat section engaged with the carrier.

17. The combination of claim 12, wherein the EMI clip comprises a clip having a cross section having two disconnected portions.

18. The combination of claim 12, wherein the EMI clip comprises a clip having a cross section that comprises two curved sections adapted to receive the first leg therebetween and a third curved section connecting the two curved sections together.

19. A method for reducing EMI emissions comprising:
providing a backplane having a plurality of printed circuit board receivers and a plurality of respective EMI reduction connectors formed parallel to the respective printed circuit board receiver, each connector having a length approximately the same as the length of the respective printed circuit board receiver;
for each printed circuit board receiver;
  connecting an associated printed circuit board to the respective printed circuit board receiver;
  electrically coupling an associated printed circuit board carrier to the EMI reduction connector by an EMI clip; and
  electrically coupling the printed circuit board to the EMI reduction connector by the EMI clip.

20. The method of clam 19, wherein:
each EMI reduction connector has a length approximately the same as the length of the respective printed circuit board receiver; and
wherein electrically coupling an associated printed circuit board carrier to the EMI reduction connector by an EMI clip comprises electrically coupling an associated printed circuit board carrier to the EMI reduction connector by an EMI clip over a substantial portion of the length of the printed circuit board carrier.

21. The method of claim 19, wherein the EMI reduction connector comprises a bracket.

22. The method of claim 19, wherein electrically coupling an associated printed circuit board carrier to the EMI reduction connector comprises electrically coupling an associated printed circuit board carrier to a connector having two opposed portions adapted to receive a leg of a bracket therebetween.

23. The method of claim 21, wherein the bracket is a right-angle bracket.

24. The method of claim 19, wherein at least one of the connectors comprises a continuous connector.

25. The method of claim 19, wherein at least one of the connectors comprises a plurality of segments disconnected from each other and wherein the length comprises the sum of all lengths of the segments.

26. A backplane and line card combination for reducing EMI emissions comprising:
a backplane;
a means for carrying a printed circuit board having a length;
a means disposed on the backplane for coupling the backplane to the means for carrying; and
a means for electrically engaging the means for carrying with the means for coupling and the printed circuit board over a substantial portion of the length of the printed circuit board.

* * * * *

UNITED STATES PATENT AND TRADEMARK OFFICE
CERTIFICATE OF CORRECTION

| | | |
|---|---|---|
| PATENT NO. | : 6,879,496 B1 | Page 1 of 1 |
| APPLICATION NO. | : 10/042966 | |
| DATED | : April 12, 2005 | |
| INVENTOR(S) | : Robert A. Marshall et al. | |

It is certified that error appears in the above-identified patent and that said Letters Patent is hereby corrected as shown below:

Column 6, Line 8, Claim 1, after "second leg, the" delete "it".

Signed and Sealed this

Fourth Day of July, 2006

JON W. DUDAS
*Director of the United States Patent and Trademark Office*

UNITED STATES PATENT AND TRADEMARK OFFICE
CERTIFICATE OF CORRECTION

PATENT NO. : 6,879,496 B1 Page 1 of 1
APPLICATION NO. : 10/042966
DATED : April 12, 2005
INVENTOR(S) : Robert A. Marshall et al.

It is certified that error appears in the above-identified patent and that said Letters Patent is hereby corrected as shown below:

Column 6, Line 18, Claim 1, after "second leg, the" delete "it".

Signed and Sealed this

First Day of July, 2008

JON W. DUDAS
*Director of the United States Patent and Trademark Office*